(12) United States Patent
Sakamoto et al.

(10) Patent No.: US 6,336,970 B1
(45) Date of Patent: Jan. 8, 2002

(54) SURFACE PREPARATION METHOD AND SEMICONDUCTOR DEVICE

(75) Inventors: Ryo Sakamoto; Ryuichi Toba; Hiroyuki Ikeda, all of Tokyo (JP)

(73) Assignee: Dowa Mining Co., Ltd., Tokyo (JP)

( * ) Notice: Subject to any disclaimer, the term of this patent is extended or adjusted under 35 U.S.C. 154(b) by 0 days.

(21) Appl. No.: 09/415,459

(22) Filed: Oct. 14, 1999

(30) Foreign Application Priority Data

Oct. 14, 1998 (JP) .................................... 10-292391

(51) Int. Cl.$^7$ .................................................. C30B 25/16
(52) U.S. Cl. .............................. 117/89; 117/94; 117/95; 438/690
(58) Field of Search ........................... 117/89, 94, 95; 438/690

(56) References Cited

U.S. PATENT DOCUMENTS 5,948,161 A    9/1999    Kizuki

FOREIGN PATENT DOCUMENTS

| EP | 0 544 438 A2 | 6/1993 | | |
|----|---|---|---|---|
| EP | 0 599 516 A2 | 6/1994 | | |
| EP | 0 692 818 A2 | 6/1995 | | |
| JP | 03/195016 | * | 1/1985 | ............ 118/724 |
| JP | 62/016520 | * | 1/1985 | ............ 438/571 |
| JP | A-5-175150 | | 7/1993 | |
| JP | 05175150 | | 7/1993 | |
| JP | A-9-320967 | | 12/1997 | |
| JP | A-10-12553 | | 1/1998 | |

OTHER PUBLICATIONS

Hirotaka Kizuki et al.; "Selective metalorganic chemical vapor deposition growth of GaAs on AlGaSA combined with situ HCl gas etching"; Nov. 1, 1993; Introduction, p. 35–42.

H. Kanber et al., "Origin and Reduction of Impurities at GaAs Epitaxial Layer–Substrate Interfaces," *Journal of Crystal Growth*, 91 (1988) 632–638.

S. Izumi et al., "Study on the accumulated impurities at the epilayer/substrate interface and their influence on the leakage current of metal–semiconductor–field effect transistors," *Journal of Crystal Growth*, 133 (1993) 123–131.

* cited by examiner

Primary Examiner—Robert Kunemund
(74) Attorney, Agent, or Firm—Oliff & Berridge, PLC

(57) ABSTRACT

A surface preparation method and semiconductor device constituted so as to enable the prevention of carrier accumulation resulting from Si acting as a donor, without making the constitution of a semiconductor manufacturing apparatus complex. When forming an epitaxial layer either on the surface of a substrate, or on the surface of a base layer, Si or an Si compound that exists on the surface of a substrate, or on the surface of a base layer, is removed in accordance with a thermal cleaning process that uses an As hydride gas as the cleaning gas.

8 Claims, 4 Drawing Sheets

CONDITION A : AsH3 GAS FLOW ··· 1000 sccm
PROCESSING TEMPERATURE ··· 850°C
PROCESSING TIME ··· 60 MINUTES CONDITION A : AsH3 GAS FLOW · · · 1000 sccm
PROCESSING TEMPERATURE · · · 850°C
PROCESSING TIME · · · 60 MINUTES CONDITION B : AsH3 GAS FLOW · · · 1000 sccm
PROCESSING TEMPERATURE · · · 800°C
PROCESSING TIME · · · 5 MINUTES CONDITION C : AsH3 GAS FLOW ··· 100 sccm
PROCESSING TEMPERATURE ··· 850°C
PROCESSING TIME ··· 5 MINUTES CONDITION D : AsH3 GAS FLOW ··· 100 sccm
PROCESSING TEMPERATURE ··· 800°C
PROCESSING TIME ··· 5 MINUTES CONDITION E : AsH3 GAS FLOW ··· 50 sccm
PROCESSING TEMPERATURE ··· 800°C
PROCESSING TIME ··· 5 MINUTES

| | Si SURFACE PREPARATION OF COMPARATIVE EXAMPLES | THERMAL CLEANING CONDITIONS | HAZE (PPM) |
|---|---|---|---|
| FIRST EMBODIMENT | | CONDITION A | 1.03 |
| SECOND COMPARATIVE EXAMPLE | UV OZONE | CONDITION A | 137.0 |
| SECOND EMBODIMENT | | CONDITION B | 1.10 |
| THIED COMPARATIVE EXAMPLE | UV OZONE | CONDITION B | 113.00 |
| THIRD EMBODIMENT | | CONDITION C | 0.45 |
| FOURTH COMPARATIVE EXAMPLE | UV OZONE | CONDITION C | 537.00 |
| FOURTH EMBODIMENT | | CONDITION D | 3.99 |
| FIFTH COMPARATIVE EXAMPLE | UV OZONE | CONDITION D | 545.00 |

FIG. 6

SURFACE PREPARATION METHOD AND SEMICONDUCTOR DEVICE

BACKGROUND OF THE INVENTION

1. Field of the Invention

The present invention relates to a surface preparation method for removing beforehand Si or an Si compound that exists on the surface of a substrate, or the surface of a base layer, when forming a single crystal layer of a Group III–V compound by epitaxial growth using an MOCVD (Metal Organics Chemical Vapor Deposition) method either on the surface of a substrate comprising a Group III–V compound semiconductor comprising As, or on the surface of a base layer, which is formed on the surface of this substrate, and which comprises a single crystal layer of a Group III–V compound comprising As.

Further, the present invention relates to a semiconductor is device constituted by forming either 1 or 2 or more single crystal layers of a Group III–V compound by epitaxial growth using an MOCVD method either on the surface of a substrate comprising a Group III–V compound semiconductor comprising As, or on the surface of a base layer, which is formed on the surface of this substrate, and which comprises a single crystal layer of a Group III–V compound comprising As.

2. Description of the Related Art

In a semiconductor device, such as a MESFET (Metal Semiconductor Field Effect Transistor), or a HEMT (High Electron Mobility Transistor), there are times when a Group III–V compound semiconductor, comprising a Group III element and a Group V element, is utilized as a semiconductor. For example, a GaAs semiconductor comprising Ga (Gallium) and As (Arsenic) can be utilized as this Group III–V compound semiconductor.

A semiconductor device comprising a GaAs semiconductor ordinarily has a substrate comprising a GaAs semiconductor, and either one or a plurality of single crystal layers formed on this substrate so as to sequentially overlap one another. In this case, a single crystal layer is formed in accordance with, for example, epitaxial growth, which uses the MOCVD method. Hereinafter, this single crystal layer is referred to as an epitaxial layer.

In a semiconductor device such as that mentioned above, either Si (Silicon) or an Si compound ordinarily exists in the interface between the substrate and an epitaxial layer, or in the interface of 2 adjacent re-grown epitaxial layers. When these Si or Si compounds exist, the Si acts as a donor in this interface, and carrier accumulation is generated. When this carrier accumulation is generated, leakage current and the like is generated. In accordance therewith, the characteristics of a semiconductor device deteriorate. Therefore, in a semiconductor device such as that mentioned above, It is necessary to prevent carrier accumulation resulting from Si acting as a donor.

As a method for preventing carrier accumulation resulting from Si acting as a donor, there is a surface preparation method, which prevents carrier accumulation by performing in advance prescribed processing either on the surface of a substrate, or the surface of a base layer (an epitaxial layer formed on the substrate surface) when forming an epitaxial layer. Up until now, 4 methods such as those hereinbelow could be used as this surface preparation method.

(1) A first method is one which attempts to prevent carrier accumulation resulting from Si acting as a donor by removing Si or an Si compound that exists either on the surface of the substrate, or on the surface of a base layer, in accordance with a wet etching process using either an acid or an alkali as described in Literature 1 hereinbelow.

Literature 1: J. Crystal Growth 91 (1988) 632 R. Kanber et al.

(2) A second method is a method which removes Si or an Si compound that exists either on the surface of the substrate, or on the surface of a base layer, in accordance with a gas etching process using a halogen-based gas as described in Literature 2 hereinbelow.

Literature 2: Japanese Patent Laid-open No. 5-175150

(3) A third method Is a method, which converts Si or an Si compound to a stable oxide, thereby rendering same electrically Inactive even should it be captured to the interface, by forming an oxide layer either on the surface of the substrate or on the surface of a base layer, in accordance with a UV (ultraviolet) ozone process as described In Literature 3, 4 hereinbelow.

Literature 3: Japanese Patent Laid-open No. 9-320967

Literature 4: J. Crystal Growth 133 (1993) 121 S. Izumi et al.

(4) A fourth method is a method, which oxidates and electrically passivates Si or an Si compound that has been captured to an interface, in accordance with an effect similar to that of the third method, by supplying oxygen to the surface of the substrate, or to the surface of a base layer, in accordance with an organic metal comprising a methoxy group as described in Literature 5 hereinbelow.

Literature 5: Japanese Patent Laid-open No. 10-12553

However, with the first method, although Si or an Si compound can be removed in accordance with etching, because either the surface of the substrate, or the surface of a base layer is exposed to ambient air in subsequent processes, such as rinsing, drying, and the loading into a chamber, either the surface of the substrate, or the surface of the base layer is once again contaminated by Si or an Si compound. The problem is, to avoid this contamination, the processes subsequent to etching must be processed in an environment in which Si or an Si compound do not exist, and the constitution of the semiconductor manufacturing apparatus becomes remarkably complex.

That is, in the clean rooms and clean benches used in the semiconductor industry, dust in the atmosphere is removed by filters. However, even though such a measure is taken, Si or an Si compound, which has a high intra-crustal Clarke number, readily reaches the surface of a substrate. Further, a filter is constituted of borosilicate glass. Consequently, it is extremely difficult to avoid contamination from the filter components themselves. Therefore, with this method, it is difficult to curb the interface carrier accumulation phenomenon with good repeatability.

Further, a problem with the second method is that the surface of the substrate, or the surface of a base layer becomes contaminated in accordance with the introduction of a halogen-based gas for surface processing (for gas etching). Further, a problem with this method is that the surface of the substrate, or the surface of a base layer is made rough by the gas etching process, and the surface morphology of an epitaxial layer formed on the surface of this substrate, or the surface of this base layer deteriorates. Furthermore, a problem with this method is that because a dedicated surface preparation (dedicated gas etching) gas supply line must be installed anew, the constitution of the semiconductor manufacturing apparatus becomes complex.

Furthermore, with the third method, the problem is that it is difficult to control the quantity of oxygen used to passivate Si or an Si compound, and moreover, in accordance with the oxidation of the surface of the substrate, or the surface of a base layer, the surface morphology of an epitaxial layer formed thereon deteriorates.

And furthermore, a problem with the fourth method is that, similar to the second method, the surface of the substrate, or the surface of a base layer becomes contaminated by an organic metal gas for surface preparation (for passivation). Further, a problem with this method is that, similar to the second method, because a dedicated surface preparation (dedicated passivation) gas supply line must be installed anew, the constitution of the semiconductor manufacturing apparatus becomes complex.

SUMMARY OF THE INVENTION

Accordingly, an object of the present invention is to provide a surface preparation method, which is capable of preventing carrier accumulation either in a substrate epitaxial layer interface or in an interface between regrown epitaxial layers, without making the constitution of a semiconductor manufacturing apparatus complex, without causing the contamination of either the surface of a substrate, or the surface of a base layer, and without degrading surface morphology.

Further, an object of the present Invention is to provide a semiconductor device. In which, in accordance with removing from an interface Si, which constitutes a cause of carrier accumulation, there is no carrier accumulation, and for which the constitution of a semiconductor manufacturing apparatus is not made complex, there is no contamination of either the surface of a substrate, or the surface of a base layer, and surface morphology is not degraded.

To solve for the above-mentioned problems, a surface preparation method of a first invention is a surface preparation method for removing beforehand Si or an Si compound that exists on the surface of a substrate, or on the surface of a base layer, when forming a single crystal layer of a Group III–V compound by epitaxial growth using an MOCVD method either on the surface of a substrate comprising a Group III–V compound semiconductor comprising As, or on the surface of a base layer, which is formed on the surface of this substrate, and which comprises a single crystal layer of a Group III–V compound comprising As, this surface preparation method being characterized in that it removes Si or an Si compound that exists either on the surface of a substrate, or on the surface of a base layer, in accordance with a thermal cleaning process, which utilizes an As hydride gas as the gas for cleaning.

With the surface preparation method of this first invention, Si or an Si compound that exists an the surface of a substrate, or on the surface of a base layer is removed as a hydride by a reduction reaction in accordance with free H (free hydrogen), which dissociates from the As hydride gas. In accordance therewith, Si or an Si compound can be removed, without making the constitution of a semiconductor manufacturing apparatus complex, without causing the contamination of either the surface of a substrate, or the surface of a base layer, and without degrading surface morphology. As a result thereof, it is possible to prevent carrier accumulation resulting from Si acting as a donor, without making the constitution of a semiconductor manufacturing apparatus complex.

A surface preparation method of a second invention is a method according to the first invention, wherein the supply quantity of As hydride gas is set at a supply quantity that is capable of completely removing Si or an Si compound that exists on the surface of a substrate, or on the surface of a bass layer.

With the surface preparation method of this second invention, it is possible to completely remove Si or an Si compound that exists on the surface of a substrate, or on the surface of a base layer. In accordance therewith. It is possible to completely prevent carrier accumulation resulting from Si acting as a donor.

Surface preparation methods of either a third or fourth invention according to either the first or second invention, respectively, wherein the As hydride gas is $AsH_3$.

A semiconductor device of a fifth through an eighth invention is a semiconductor device, which is constituted by forming either 1 or 2 or more single crystal layers of a Group III–V compound by epitaxial growth using an MOCVD method, either on the surface of a substrate comprising a Group III–V compound semiconductor comprising As, or on the surface of a base layer, which is formed on the surface of this substrate, and which comprises a single crystal layer of a Group III–V compound comprising As, this semiconductor device being characterized In that the 1 or 2 or more opitaxal layers of a Group III–V compound are formed after Si or an Si compound that exists on the surface of a substrate, or on the surface of a base layer has been removed in accordance with a surface preparation method of the first through the fourth inventions.

With the semiconductor device of this fifth through eighth invention, Si or an Si compound that exists on the surface of a substrate, or on the surface of a base layer is removed in accordance with a thermal cleaning process, which uses an As hydride gas as the cleaning gas. In accordance therewith, it is possible to provide a semiconductor device in which there is no carrier accumulation, and for which the constitution of a semiconductor manufacturing apparatus is not made complex, there is no contamination of either the surface of a substrate or the surface of a base layer, and surface morphology is not degraded.

DESCRIPTION OF THE PREFERRED EMBODIMENTS

Figure 1:
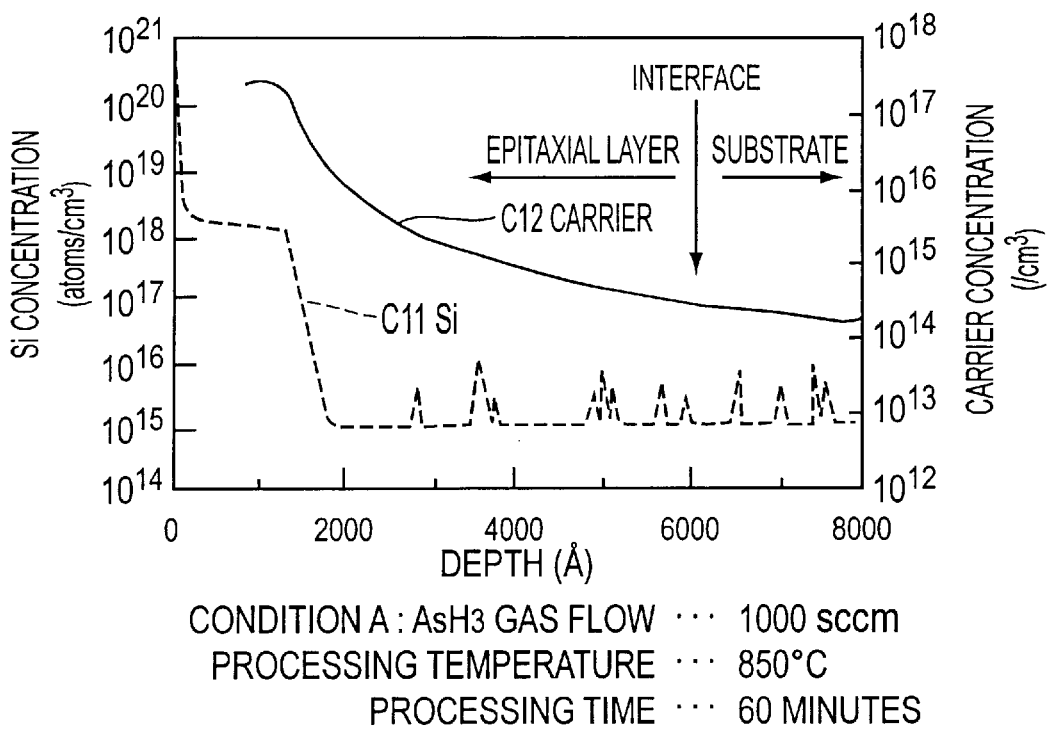
FIG. 1 is a characteristic diagram showing the results of analysis of Si concentration, and the results of an evaluation of carrier accumulation in a first embodiment of the present invention.
Figure 2:
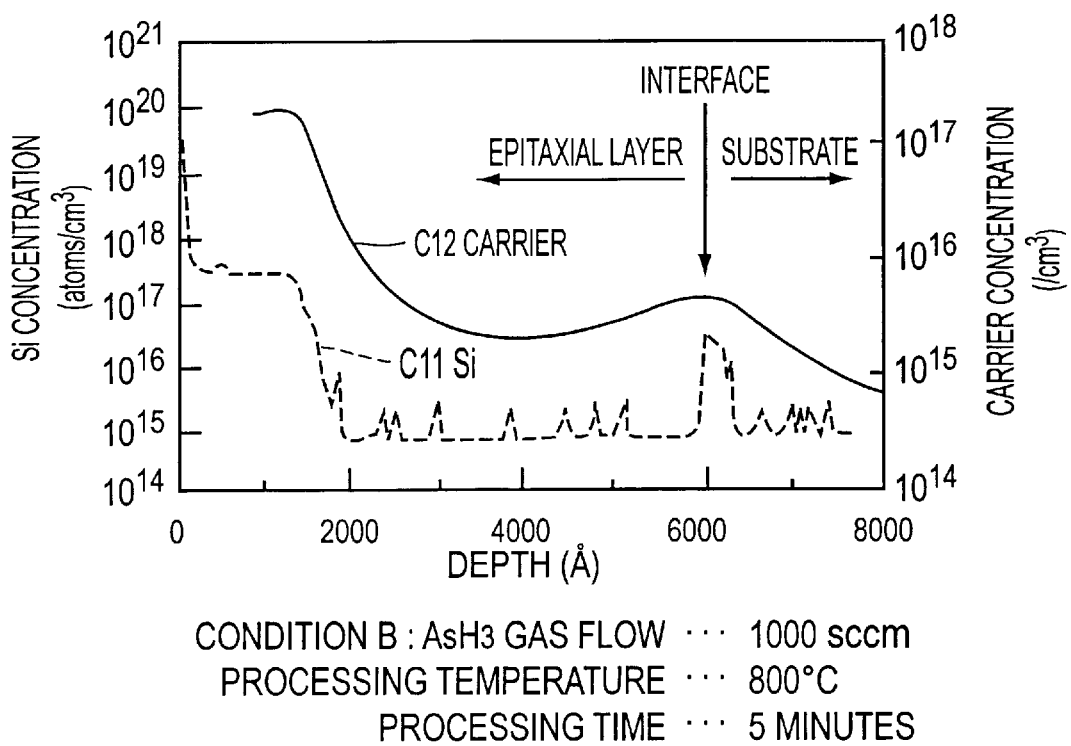
FIG. 2 is a characteristic diagram showing the results of analysis of Si concentration, and the results of an evaluation of carrier accumulation In a second embodiment of the present invention.
Figure 3:
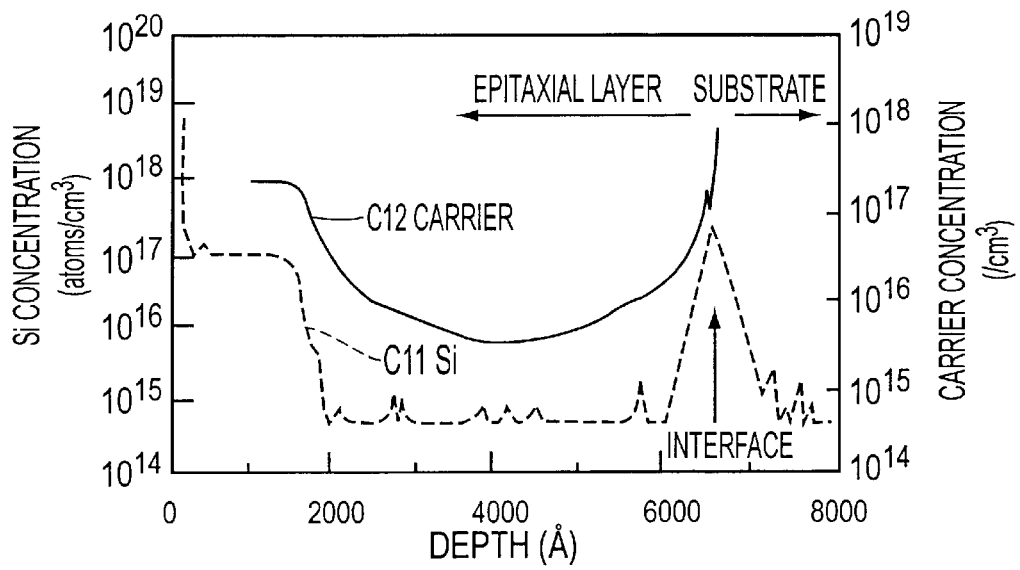
FIG. 3 is a characteristic diagram showing the results of analysts of Si concentration, and the results of an evaluation of carrier accumulation in a third embodiment of the present invention.

Aspects of the embodiments of the present invention will be explained in detail hereinbelow.

A First Aspect of the Embodiment

Constitution

This aspect of the embodiment is constituted so as to remove beforehand Si or an Si compound that exists on the surface of a substrate, or on the surface of a base layer, in accordance with a thermal cleaning process, which uses $AsH_3$ gas as the cleaning gas, when forming by epitaxial growth using an MOCVD method an epitaxial layer comprising, for example, a GaAs compound, either on the surface of an undoped semi-insulator substrate comprising, for example, a GaAs semiconductor, or on the surface of a base layer, which is formed on the surface of this substrate, and which comprises an epitaxial layer of, for example, a GaAs compound.

That is, in the past, in a semiconductor device comprising a GaAs semiconductor, impurities that existed on either the surface of a substrate, or on the surface of a base layer, used to be removed beforehand by a thermal cleaning process when forming an epitaxial layer by epitaxial growth using an MOCVD method.

However, for conventional surface preparation, which used the thermal cleaning process thereof, the objective was to remove a natural oxide layer or organic impurities that existed on the surface of a base layer. Consequently, measurements taken of the quantity of oxygen and the quantity of impurities that existed either in the interface between a substrate and an epitaxial layer, or in the interface of 2 adjacent re-grown epitaxial layers in a semiconductor device for which this surface preparation was performed, revealed that although the quantity of carbon, which appears to originate from a quantity of oxygen and a quantity of organic matter, was reduced, the quantity of Si and other impurities was not reduced. And when carrier concentration in an interface was measured In accordance with the CV (Capacitance Voltage) method, carrier accumulation was apparent in the interface.

At this time, it was ascertained that a correlation exists between carrier concentration and Si concentration. From this fact, it is believed that interface carrier accumulation has its origins In Si or an Si compound that exists in the interface. To remove this Si or Si compound, the supply quantity of $AsH_3$ gas for cleaning was increased. As a result thereof, it became clear that Si or an Si compound that exists on the surface of a substrate, or on the surface of a base layer was converted to a hydride and removed by a reduction reaction in accordance with free H dissociated from the $AsH_3$ gas.

Accordingly, in this aspect of the embodiment, the constitution is such that in accordance with supplying much more $AsH_3$ at thermal cleaning when removing a natural oxide layer or organic impurities, not only a natural oxide layer or organic impurities, but also Si or an Si compound are removed as well.

It was learned that, according to such a constitution, it is possible to remove oxygen and Si or an Si compound that exist on the surface of a substrate, or on the surface of a base layer, without degrading the surface morphology of a formed epitaxial layer, and that it is possible to obtain a smooth CV profile, in which there is no carrier accumulation in an interface.

Furthermore, as a supply quantity of $ASH_3$ gas, for example, there is set a supply quantity, which is capable of completely removing Si or an Si compound. This $AsH_3$ gas supply quantity is not specified since it will differ in accordance with the state of a device, and the state of the surface of a substrate, or the surface of a base layer. Therefore, when such a supply quantity is set, it is desirable to analyze the state of the interface subsequent to the formation of an epitaxial layer, and to optimize this setting based on the analysts results thereof.

Further, a temperature of 300° C. or higher is set as the processing temperature when performing surface preparation.

This is so that $AsH_3$ completely dissociates. The temperature is generally set in the range of 500° C. –850° C.

Furthermore, a pressure of normal pressure or lower is set as the processing pressure when performing surface preparation.

Furthermore, when supplying $AsH_3$ gas to the reaction chamber, it can either be supplied alone, or it can be supplied while diluting it in a carrier gas. In this case, there are no particular limits placed on the carrier gases capable of being used, but an inert gas, such as $H_2$ gas, or Ar gas is generally used.

Operation

The operation of the above-mentioned constitution will be explained. When removing Si or an Si compound that exists on the surface of a substrate, or on the surface of a base layer, $AsH_3$ gas is supplied to the reaction chamber housing the substrate. In accordance therewith, impurities that exist either on the surface of a substrate, or on the surface of a bass layer, are removed as hydrides by a reduction reaction in accordance with a free H gas dissociated from the $AsH_3$ gas.

In this case, $AsH_3$ gas is supplied in a quantity that is at the least capable of completely removing Si or an Si compound that exists either on the surface of a substrate, or on the surface of a base layer. In accordance therewith, not only are a natural oxide layer and organic impurities that exist either on the surface of a substrate, or on the surface of a base layer, removed, but Si or an Si compound is also completely removed.

Effect

According to this aspect of the embodiment, which was described in detail above, it is possible to obtain an effect such as that hereinbelow.

(1) First, according to this aspect of the embodiment, when removing Si or an Si compound that exists on the surface of a substrate, or on the surface of a base layer, removal is in accordance with a thermal cleaning process. In accordance therewith, Si or an Si compound can be removed, without making the constitution of a semiconductor manufacturing apparatus complex, without causing the contamination of either the surface of a substrate, or the surface of a base layer, and without degrading surface morphology. As a result thereof, it is possible to prevent carrier accumulation resulting from Si acting as a donor, without making the constitution of a semiconductor manufacturing apparatus complex.

(2) Further, according to ds aspect of the embodiment, the supply quantity of $AsH_3$ gas for thermal cleaning is set at a supply quantity, which is capable of completely removing Si or an Si compound. In accordance therewith, it is possible to completely remove Si or an Si compound. As a result thereof, it is possible to completely prevent carrier accumulation resulting from Si acting as a donor.

(3) Furthermore, according to this aspect of the embodiment, a temperature of 300° C. or higher is set as the processing temperature when performing surface preparation.

In accordance therewith, it is possible to completely dissociate $AsH_3$ gas. As a result thereof, it is possible to improve the removal efficiency of Si or an Si compound.

(4) And furthermore, according to this aspect of the embodiment, a pressure of normal pressure or lower is set as the processing pressure when performing surface preparation, and the supply and discharge of gas is constantly carried out. In accordance therewith, it is possible to remove Si hydride from the reaction chamber during surface preparation.

(5) Further, according to this aspect of the embodiment, when removing Si or an Si compound that exists on the surface of a substrate, or on the surface of a base layer, removal is in accordance with a thermal cleaning process. In accordance therewith, the removal of a natural oxide layer, or organic impurities that exist on the surface of a substrate, or on the surface of a base layer, can be done at the same time, and via the same process, as the removal of Si or an Si compound. In accordance therewith, it is possible to simplify the preprocessing of prior to forming an epitaxial layer.

Other Aspects of the Embodiment

A first aspect of the embodiment of the present invention was explained in detail above, but the present invention is not limited to an aspect of the embodiment such as that described above.

(1) For example, for the above aspect of the embodiment, an explanation was given for when an undoped semi-insulator substrate comprising a GaAs semiconductor is used as a substrate. However, the present invention can use a substrate, which is a semiconductor other than a GaAs semiconductor, and which comprises a Group III–V compound semiconductor comprising As.

(2) Further, for the above aspect of the embodiment, an explanation was given for when an epitaxial layer comprising a GaAs compound is used as a base layer. However, the present invention can use an epitaxial layer, which comprises a Group III–V compound comprising As other than a GaAs compound. For example, the present invention can use an epitaxial layer comprising an $Al_xGa_{(1-x)}As$ compound, an $In_xGa_{(1-x)}As$ compound, an $Al_x\{(In_yGa_{(1-y)})\}_{(1-x)}P$, or an InGaAsP compound.

(3) And furthermore, for the above aspect of the embodiment, an explanation was given for when an epitaxial layer comprising a GaAs compound is used as an epitaxial layer, which is formed either on the surface of a substrate, or on the surface of a base layer. However, the present invention can use an epitaxial layer, which comprises a Group III–V compound comprising As other than a GaAs compound. And furthermore, the present invention can use an epitaxial layer comprising a Group III–V compound, which does not comprise As.

(4) And furthermore, the present invention can also be applied to a semiconductor device other than a MESPETD or a HEMT.

(5) In addition, the present invention, quite naturally, can be implemented in various and sundry variations in a scope that does not deviate from the gist thereof.

Embodiments (Examples)

The embodiments of the present invention will be explained here by comparing them to comparative examples. Furthermore, the embodiments and comparative examples explained hereinbelow are implemented with the state of a device, and the state of either the surface of a substrate, or the surface of a base layer, being the same state.

(1) First Embodiment

In a first embodiment of the present invention, firstly, surface preparation is performed on the surface of a substrate in accordance with a thermal cleaning process. In this case, an undoped semi-insulator substrate comprising a GaAs semiconductor is used as the substrate. Further, $AsH_3$ gas is used as the gas for cleaning. In this case, the $AsH_3$ gas was supplied while being diluted In a carrier gas. $H_2$ gas was used as the carrier gas therefore. Furthermore, Condition A hereinbelow was used as the processing conditions, such as the $AsH_3$ gas supply quantity.

Condition A: $AsH_3$ Gas Flow . . . 1000 sccm
Processing Temperature . . . 850° C.
Processing Time . . . 60 minutes When this surface preparation was complete, an epitaxial layer was formed on the undoped semi-insulator substrate by epitaxial growth using the MCVD method. In this case, a roughly 5000 angstrom impurity-free epitaxial layer comprising a Gaks compound (hereinafter referred to as a "GaAs buffer layer") was formed as the epitaxial layer. TMG (Trimethylgallium) and $AsH_3$ were used as the raw materials for forming this GaAs buffer layer. Further, $H_2$ gas was used as a carrier gas for diluting these raw material gases.

When this GaAs buffer layer formation process was complete, an epitaxial layer was successively formed on the GaAs buffer layer by epitaxial growth using the KOCVD method. In this case, a roughly 1500 angstrom epitaxial layer comprising a GaAs semiconductor, and comprising donor-type impurities (hereinafter referred to as an "n-GaAs layer") was formed as this epitaxial layer. Here, n is approximately $3\times10^{17}$ cm$^{-3}$. The same raw materials as when the GaAs buffer layer was formed were used as the raw materials and carrier gas for forming this n-GaAs layer, and $Si_2H_6$(disilane) was used as the dopant gas.

(2) Second Embodiment

This second embodiment is the same as the first embodiment, with the exception of the processing conditions for surface preparation. That is, in this embodiment, Condition B hereinbelow was used as the processing conditions for surface preparation. As for this Condition B, the $AsH_3$ gas flow was the same as that in Condition A, the processing temperature was 50° C. lower than that in Condition A, and the processing time worked out to $\frac{1}{12}^{th}$ that of Condition A.

Condition B: $AsH_3$ Gas Flow . . . 1000 sccm
Processing Temperature . . . 800 ° C.
Processing Time . . . 5 minutes (3) Third Embodiment This third embodiment is also the same as the first embodiment, with the exception of the processing conditions for surface preparation. That is, in this embodiment, Condition C hereinbelow was used as the processing conditions for surface preparation. As for this Condition C, the $AsH_3$ gas flow was $\frac{1}{10}^{th}$ that of Condition A, the processing temperature was the same as that in Condition A, and the processing time worked out to $\frac{1}{12}^{th}$ that of Condition A.

Condition C: $AsH_3$ Gas Flow . . . 100 sccm
Processing Temperature . . . 850° C.
Processing Time . . . 5 minutes (4) Fourth Embodiment This fourth embodiment is also the same as the first embodiment, with the exception of the processing conditions for surface preparation. That is, in this embodiment, Condition D hereinbelow was used as the processing conditions for surface preparation. As for this Condition D, the $AsH_3$ gas flow was $\frac{1}{10}^{th}$ that of Condition A, the processing temperature was 50° C. lower than that in Condition A, and the processing time worked out to $\frac{1}{12}^{th}$ that of Condition A.

Condition D: $AsH_3$ Gas Flow . . . 100 sccm
Processing Temperature . . . 800° C.
Processing Time . . . 5 minutes (5) Comparison of the First–Fourth Embodiments Four semiconductor devices manufactured in accordance with the first–fourth embodiments described above were analyzed using SiMS (Secondary Ion Mass Spectroscopy) as to their Si concentration (also including Si comprising an Si compound) and were evaluated using the CV method as to their carrier concentration.

FIG. 1–FIG. 4 are characteristic diagrams showing the results of Si concentration analyses, and the results of carrier concentration evaluations for the first-fourth embodiments, respectively. In these diagrams, the horizontal axis represents the depth (angstroms) from the surface of a semiconductor device (surface of an n-GaAs layer), the vertical axis of the left side represents Si concentration (atoms/cm$^3$), and the vertical axis of the right side represents carrier concentration (/cm$^3$). Further, characteristic curve C11 represents the results of analysis of Si concentration, and characteristic curve C12 represents the results of evaluation of carrier concentration (CV profile).

Figure 4:
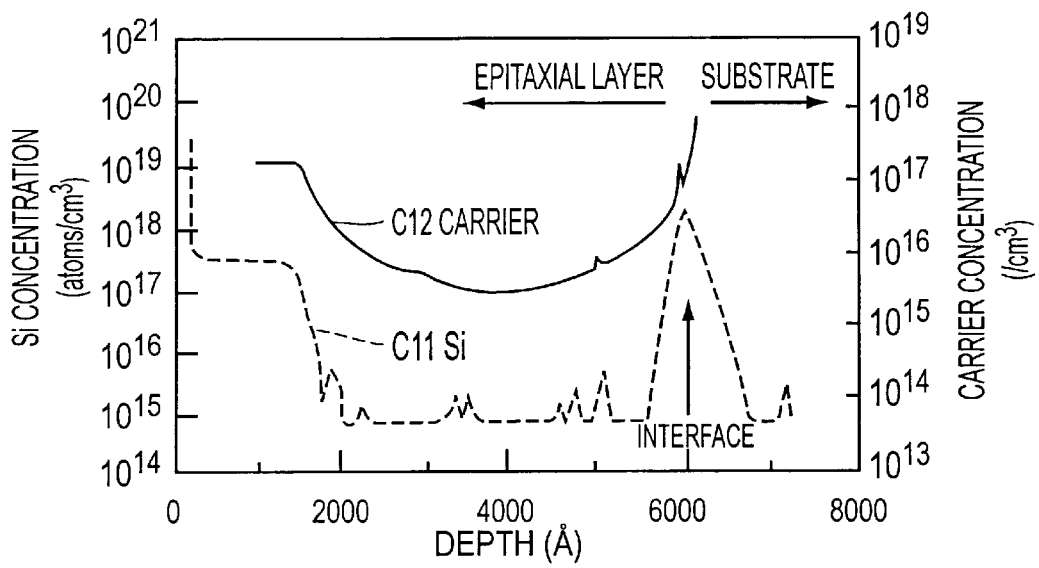
FIG. 4 is a characteristic diagram showing the results of analysis of Si concentration, and the results of an evaluation of carrier accumulation in a fourth embodiment of the present invention.

As shown in FIG. 1–FIG. 4, the Si concentration In the interface between the undoped semi-insulator substrate and the GaAs buffer layer was the smallest in the case of the first embodiment (FIG. 1), was the next smallest in the case of the second embodiment (FIG. 2), and was the next smallest thereto in the case of the third embodiment (FIG. 3) and in the case of the fourth embodiment (FIG. 4). From this it is clear that the greater the supply quantity of AsH$_3$ gas, the greater the quantity of removed Si or Si compound.

Further, by comparing the second embodiment (FIG. 2) with the third embodiment (FIG. 3), it is clear that it is mainly the supply quantity of ASH$_3$ gas that exhibits an effect on the in removal of Si or an Si compound, and that processing temperature exhibits practically no effect. From the above, it is clear that the supply quantity of AsH$_3$ gas can be much greater than required for removing Si or an Si compound.

Further, from FIG. 1–FIG. 4, it is clear that a correlation exists between Si concentration and carrier concentration. That is, when the Si concentration is large, the carrier concentration becomes large, and when the Si concentration is small, the carrier concentration becomes small.

In accordance therewith, the carrier concentration in the interface between the undoped semi-Insulator substrate and the GaAs buffer layer was the smallest in the case of the first embodiment (FIG. 1), was the next smallest in the case of the second embodiment (FIG. 2), and was the next smallest thereto in the case of the third embodiment (FIG. 3) and in the case of the fourth embodiment (FIG. 4).

From the above, it is clear that to decrease the carrier concentration of an Interface, the supply quantity of AsH$_3$ gas should be much greater than required.

(6) First Comparative Example

For this first comparative example, the first–fourth embodiments are the same, with the exception of the surface preparation method for preventing carrier accumulation resulting from Si acting as a donor, and the surface preparation method for removing a natural oxide layer, and organic impurities.

That is, in this first comparative example, the conventional third method (UV ozone processing method) was used as the surface preparation method for preventing carrier accumulation resulting from Si acting as a donor. Further, a thermal cleaning method for removing a natural oxide layer and so forth was used as the surface preparation method for removing a natural oxide layer, and organic impurities.

That is, a thermal cleaning method, which used as the supply quantity of AsH$_3$ a supply quantity capable of removing a natural oxide layer and so forth, rather than a supply quantity capable of removing Si or an Si compound.

In this case, for example, Condition E of hereinbelow was used as the processing conditions. That is, the AsH$_3$ gas flow was $\frac{1}{20}^{th}$ that of Condition A, the processing temperature was 50° C. lower than that in Condition A, and the processing time worked out to $\frac{1}{12}^{th}$ that of Condition A.

Condition E: AsH$_3$ Gas Flow . . . 50 sccm
    Processing Temperature . . . 800° C.
    Processing Time . . . 5 minutes (7) Comparison of the First Comparative Example With the First–Fourth Embodiments The Si concentration, oxygen concentration, carrier concentration, and GaAs buffer layer surface morphology in the first comparative example were analyzed, evaluated and measured. Here, the Si concentration and oxygen concentration were analyzed using SiMS, the carrier concentration was evaluated using the CV method, and surface morphology was measured using laser scattering.

Figure 5:
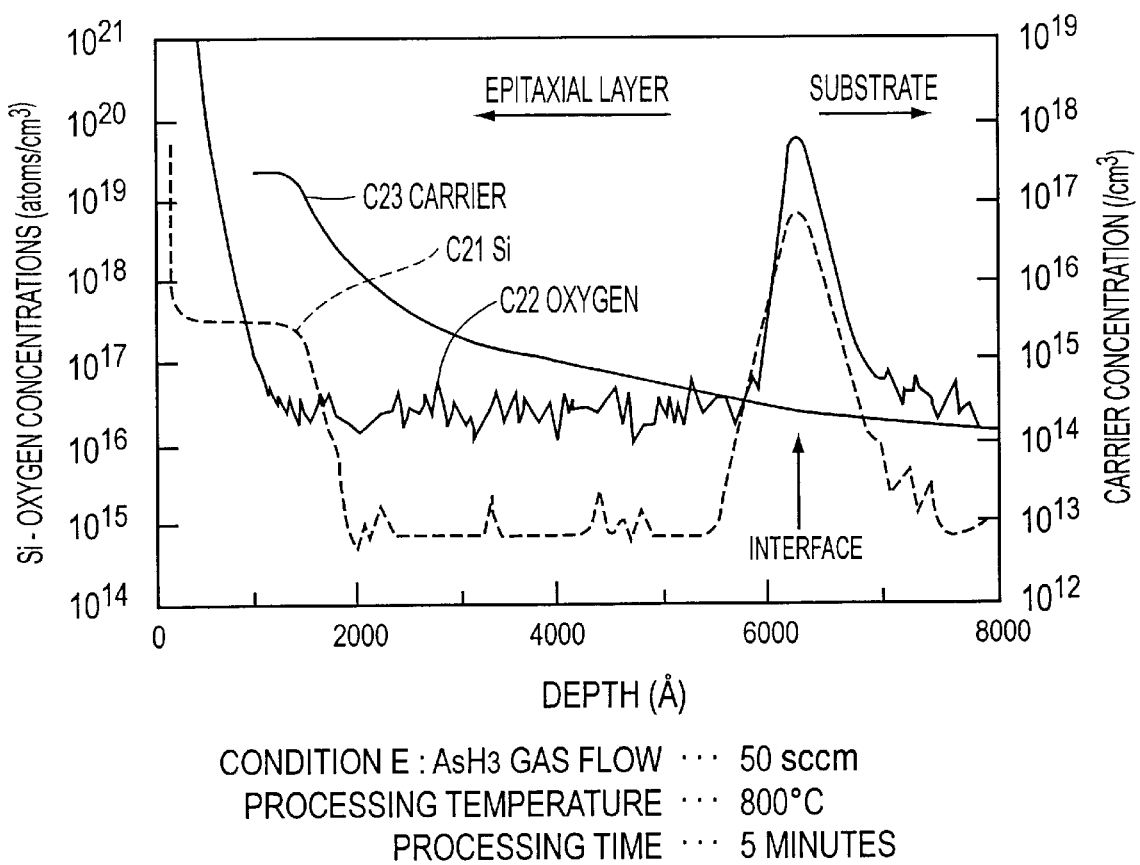
FIG. 5 is a characteristic diagram showing the results of analyses of Si concentration and oxygen concentration, and the results of evaluations of carrier accumulation in a first comparative example, in which the first-fourth embodiments of the present invention are compared; and to FIG. 6 is a diagram showing haze measurement results in a second–fifth comparative examples, in which the first-fourth embodiments of the present invention are compared.

FIG. 5 is a characteristic diagram showing the results of analyses of Si concentration and oxygen concentration, and the results of evaluation of carrier concentration In the first comparative example. In the figure, characteristic curve 21 represents the results of analysis of Si concentration, characteristic curve 22 represents the results of analysts of oxygen concentration, and characteristic curve 23 represents the results of evaluation of carrier concentration.

As shown In FIG. 5, in the first comparative example, there is much Si or Si compound residue in the interface between the undoped semi-insulator substrate and the GaAs buffer layer. However, in this case, there is also much oxygen residue at the same time. In accordance therewith, Si is oxidized and passivated. As a result thereof, carrier accumulation is not apparent in the interface.

However, in this first comparative example, a UV ozone processing method was used as the method for preventing carrier accumulation resulting from Si acting as a donor. In accordance therewith, there was an abundance of haze on the surface of the GaAs buffer layer. As a result thereof, the surface morphology of the GaAs buffer layer was degraded. In contrast thereto, in the above-mentioned first–fourth embodiments of the present invention, there is no increase in haze. This will be explained hereinbelow by referring to a second–fifth comparative example.

(8) Second–Fifth Comparative Examples

These second–fifth comparative examples are the same as the first comparative example, with the exception of the processing conditions for the thermal cleaning process. That is, in the second–fifth comparative examples, the same conditions A, B, C, D as in the first–fourth embodiments. Respectively, are used Instead of Condition E of the first comparative example, as processing conditions for the thermal cleaning process. This is to make it easier to compare the state, wherein haze is generated in accordance with UV ozone processing, with that of the first–fourth embodiments.

(9) Comparison of the Second–Fifth Comparative Examples With the First–Fourth Embodiments FIG. 6 is a diagram showing the results of measuring haze (PPM) in the first–fourth embodiments, and the second–fifth comparative examples. Furthermore, a Tencor Surfscan 6200 was used to measure this haze.

As shown in the figure, for the first–fourth embodiments, the quantity of haze on the surface of the n-GaAs layer was small. In accordance therewith, the surface morphology of the n-GaAs layer did not degrade in the first–fourth embodiments. By contrast thereto, for the second–fifth comparative examples, the quantity of haze on the surface of the n-GaAs layer at a minimum was more than 100 times greater than that of the first–fourth embodiments, respectively. In accordance therewith, the surface morphology of the n-GaAs layer was degraded in the second–fifth comparative examples.

From the above it is clear that the quantity of haze becomes larger and surface morphology is degraded, in accordance with using the UV ozone processing method.

Furthermore, as is clear from a comparison of the second and third comparative examples with the fourth and fifth comparative examples, even when the UV ozone processing method is used as the surface preparation method for carrier accumulation prevention, when removing a natural oxide layer and so forth, the quantity of haze can made smaller by increasing the supply quantity of $AsH_3$ over what it was in the past.

As explained above, according to the surface preparation methods of the first through fourth inventions, when removing Si or an Si compound that exists either on the surface of a substrate, or on the surface of a base layer, removal is performed in accordance with a thermal cleaning process, which uses an As hydride gas as the gas for cleaning. In accordance therewith, it is possible to prevent carrier accumulation resulting from Si acting as a donor, without making the constitution of a semiconductor manufacturing apparatus complex.

Further, according to the surface preparation method of the second invention, the supply quantity of As hydride gas in the method of the first invention is set at a supply quantity that enables the complete removal of Si or an Si compound. In accordance therewith, it is possible to completely prevent carrier accumulation resulting from Si acting as a donor.

Furthermore, according to the surface preparation methods of the fifth through the eighth inventions, Si or an Si compound that exists either on the surface of a substrate, or on the surface of a base layer, is removed In accordance with a surface preparation method of the first through the fourth inventions. In accordance therewith, it is possible to provide a semiconductor device, in which there is no carrier accumulation resulting from Si acting as a donor, and for which the constitution of a semiconductor manufacturing apparatus is not made complex.

What is claimed is:

1. A surface preparation method, which removes beforehand Si or an Si compound that exists on the surface of a substrate, or on the surface of a base layer, when forming a single crystal layer of a Group III–V compound by epitaxial growth using an MOCVD method either on the surface of said substrate, which comprises a Group III–V compound semiconductor comprising As, or on the surface of said base layer, which is formed on the surface of said substrate, and which comprises a single crystal layer of a Group III–V compound comprising As, wherein Si or an Si compound that exists either on the surface of said substrate, or on the surface of said base layer, is removed in accordance with a thermal cleaning process, which utilizes an As hydride gas as the gas for cleaning, wherein said As hydride gas consists essentially of As hydride.

2. The surface preparation method according to claim 1, wherein the supply quantity of said As hydride gas is set at a quantity that is capable of completely removing Si or an Si compound that exists on the surface of said substrate, or on the surface of said base layer.

3. The surface preparation method according to claim 1, wherein said As hydride gas is $AsH_3$.

4. The surface preparation method according to claim 2, wherein said As hydride gas is $AsH_3$.

5. A semiconductor device, which is constituted by forcing either 1 or more single crystal layers of a Group III–V compound by epitaxial growth using an MOCVD method, either an the surface of a substrate, which comprises a Group III–V compound semiconductor comprising As, or on the surface of a base layer, which is formed on the surface of said substrate, and which comprises a single crystal layer of a Group III–V compound comprising As, wherein the 1 or 2 or more single crystal layers of said Group III–V compound are formed after Si or an Si compound that exists on the surface of said substrate, or on the surface of said base layer, has been removed in accordance with the surface preparation method of claim 1.

6. A semiconductor device, which is constituted by forming either 1 more single crystal layers of a Group III–V compound by epitaxial growth using an MOCVD method, either on the surface of a substrate, which comprises a Group III–V compound semiconductor comprising As, or on the surface of a base layer, which is formed on the surface of said substrate, and which comprises a single crystal layer of a Group III–V compound comprising As, wherein the 1 or 2 or more single crystal layers of said Group III–V compound are formed after Si or an Si compound that exists on the surface of said substrate, or on the surface of said base layer, has been removed in accordance with the surface preparation method of claim 2.

7. A semiconductor device, which is constituted by forming either 1 or more single crystal layers of a Group III–V compound by epitaxial growth using an CCVD method, either on the surface of a substrate, which comprises a Group III–V compound semiconductor comprising As, or on the surface of a base layer, which is formed on the surface of said substrate, and which comprises a single crystal layer of a Group III–V compound comprising As, wherein the 1 or 2 or more single crystal layers of said Group III–V compound are formed after Si or an Si compound that exists on the surface of said substrate, or on the surface of said base layer, has been removed in accordance with the surface preparation method of claim 3.

8. A semiconductor device, which is constituted by forming either 1 or more single crystal layers of a Group III–V compound by epitaxial growth using an MOCVD method, either on the surface of a substrate, which comprises a Group III–V compound semiconductor comprising As, or on the surface of a base layer, which is formed on the surface of said substrate, and which comprises a single crystal layer of a Group III–V compound comprising As, wherein the 1 or 2 or more single crystal layers of said Group III–V compound are formed after Si or an Si compound that exists on the surface of said substrate, or on the surface of said base layer, has been removed in accordance with the surface preparation method of claim 4.

* * * * *

UNITED STATES PATENT AND TRADEMARK OFFICE
CERTIFICATE OF CORRECTION

PATENT NO. : 6,336,970 B1
DATED : January 8, 2002
INVENTOR(S) : Ryo Sakamoto, Ryuichi Toba and Hiroyuki Ikeda It is certified that error appears in the above-identified patent and that said Letters Patent is hereby corrected as shown below:

<u>Column 12,</u>
Line 10, change "an" to -- on --;
Line 21, after "1" insert -- or --; and
Line 35, change "CCVD" to -- MOCVD --.

Signed and Sealed this

Third Day of September, 2002

*Attest:*

*Attesting Officer*

JAMES E. ROGAN
*Director of the United States Patent and Trademark Office*